(12) United States Patent
Kuyel et al.

(10) Patent No.: US 6,952,130 B2
(45) Date of Patent: Oct. 4, 2005

(54) COMPENSATION OF OFFSET DRIFT WITH TEMPERATURE FOR OPERATIONAL AMPLIFIERS

(75) Inventors: Turker Kuyel, Austin, TX (US); Gabriel Morcan, Plano, TX (US); Turgut Feyiz, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 84 days.

(21) Appl. No.: 10/748,509

(22) Filed: Dec. 30, 2003

(65) Prior Publication Data
US 2004/0178846 A1 Sep. 16, 2004

Related U.S. Application Data
(60) Provisional application No. 60/437,598, filed on Dec. 31, 2002.

(51) Int. Cl.[7] .................................. H03F 1/02
(52) U.S. Cl. ..................... 330/9; 330/256; 330/289
(58) Field of Search ............................ 330/9, 256, 289

(56) References Cited

U.S. PATENT DOCUMENTS

| | | | |
|---|---|---|---|
| 4,490,713 A | | 12/1984 | Mrozowski et al. |
| 4,495,470 A | * | 1/1985 | Bristol ............................ 330/9 |
| 4,833,423 A | * | 5/1989 | Molloy ......................... 330/265 |
| 4,972,188 A | * | 11/1990 | Clement et al. ............. 341/118 |
| 5,010,302 A | * | 4/1991 | Krempl et al. ............... 330/107 |
| 5,386,160 A | * | 1/1995 | Archer et al. ................ 327/513 |
| 6,396,339 B1 | | 5/2002 | Jacobs |
| 6,628,169 B2 | * | 9/2003 | Ivanov et al. ................ 330/256 |

OTHER PUBLICATIONS

Gray, Paul R., et al., *Analysis and Design of Analog Integrated Circuits*, Third Edition, John Wiley & Sons, Inc., © 1993, pp. 250–256, 445–458 and 466–470.

* cited by examiner

*Primary Examiner*—Patricia Nguyen
(74) *Attorney, Agent, or Firm*—J. Dennis Moore; W. James Brady, III; Frederick J. Telecky, Jr.

(57) ABSTRACT

A method and apparatus for compensating for offset and drift of offset in an amplifier circuit having metal oxide semiconductor transistors in an input stage thereof and including a node responsive to a bias to change the offset of the amplifier circuit. In one embodiment, an offset digital-to-analog converter provides a first programmable bias corresponding to an offset of the amplifier circuit. A drift digital-to-analog converter provides a second programmable bias corresponding to a drift of the offset of the amplifier circuit. The first programmable bias and the second programmable bias are combined and coupled to the node. In another embodiment, a first programmable offset/drift generator is provided, capable of sourcing a first bias to the amplifier node compensating for a first portion of the offset and a first portion of the drift of the offset of the amplifier circuit. A second programmable offset/drift generator is provided, capable of sourcing a second bias to the amplifier node compensating for a second portion of the offset and a second portion of the drift of the offset of the amplifier circuit, wherein the rate of drift compensation with temperature of the second bias is different from the rate of compensation of the second bias. By suitable programming of the first and second programmable offset/drift generators the compensation of the offset and the offset of the drift of the amplifier circuit may be optimized.

5 Claims, 4 Drawing Sheets

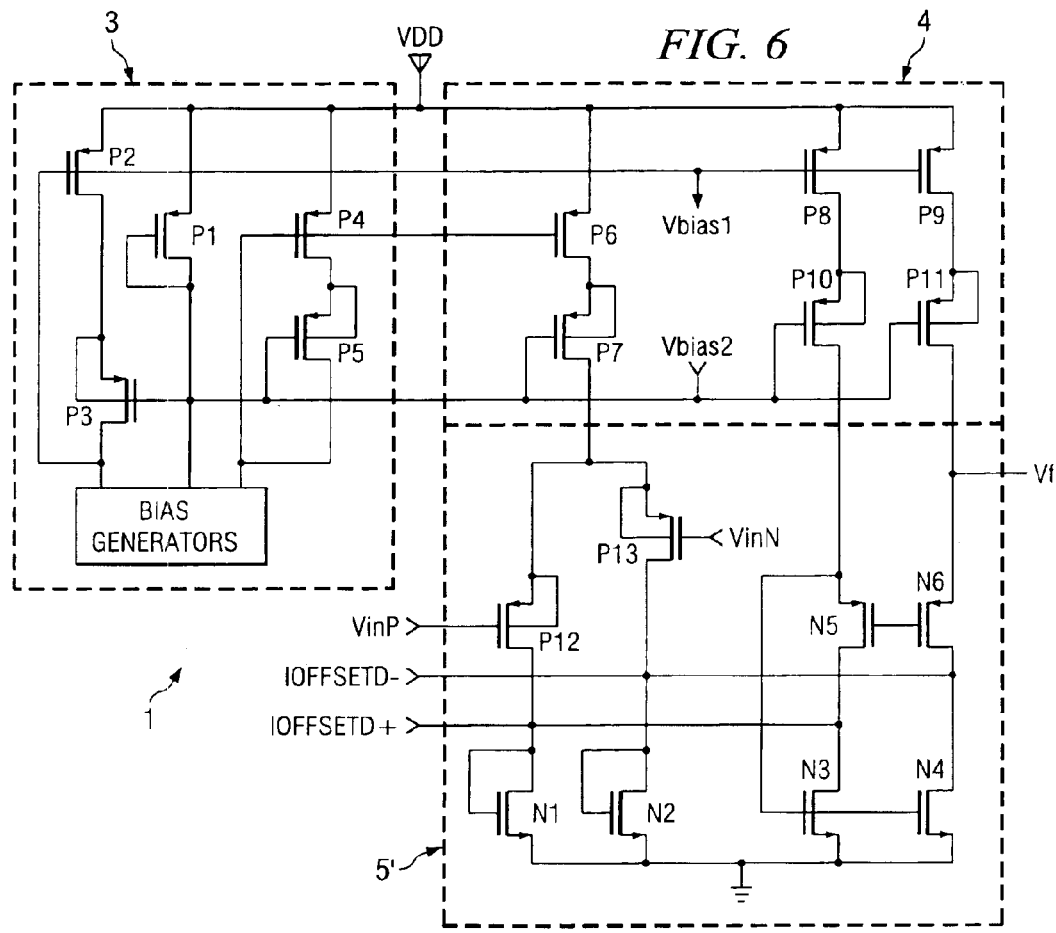

COMPENSATION OF OFFSET DRIFT WITH TEMPERATURE FOR OPERATIONAL AMPLIFIERS

This application claims priority under 35 USC § 119(e)(1) of provisional application Ser. No. 60/437,598, filed Dec. 31, 2002.

TECHNICAL FIELD OF THE INVENTION

This invention relates to operational amplifiers and circuits that use them, and more particularly relates to a method and apparatus for compensating for offset and the drift of input offset with temperature.

BACKGROUND OF THE INVENTION

Operational amplifiers, or, "op-amps," are well-known circuits used in a variety of applications. For example, operational amplifiers are used as active filters, oscillators, voltage and current amplifiers, integrators and differentiators, analog-to-digital converters ("ADCs") and digital-to-analog converters ("DAC's"), to name a few. Desirable characteristics of op-amps include high open loop gain, high input impedance, low output impedance low offset and low offset drift.

However, one problem op-amps suffer is called "offset error." This effect occurs because of the inherent lack of precision in the matching of the op-amp's components, including the two differential input transistors. Ideally, the op-amp has a zero output voltage for zero input voltage. But, when the op-amp's input transistors are unmatched, the op-amp may have a non-zero output voltage for zero input, which is the offset error. The voltage applied to the differential input that makes the output voltage zero is called the "input offset voltage." This offset error can have an adverse effect in any circuit in which the op-amp is used, if compensation is not provided for it.

In precision applications, it is necessary for the offset error to be minimized, and numerous approaches to that problem have been proposed and implemented. However, even after compensating for the offset error, the factors giving rise to it can vary with varying temperature, giving rise to a variation in the offset error with temperature, called "offset drift." This offset drift can make compensation for offset error that is static with respect to temperature inadequate in precision applications.

Approaches to compensate for offset drift have therefore been proposed. One approach is disclosed in U.S. Pat. No. 6,396,339, which issued to Karl H. Jacobs on May 28, 2002, and was assigned to Texas Instruments Incorporated. In the technique disclosed therein, input offset voltage is compensated by balancing the operational amplifier over the operating temperature range after the device has been initially trimmed. Their operational amplifier employs a lower input offset voltage, which remains low over the operating temperature range without a separate temperature compensation circuit. They provide a separate trim device for each current path of the circuit to maintain symmetry. Thus, the current paths of the differential circuit have the same leakage current upon temperature excursions. Ideally, the leakage current will occur in both current paths of the differential circuit and maintain circuit balance.

Another example is disclosed in U.S. Pat. No. 4,490,713, which issued to Andrij Mrozowski et al. on Dec. 25, 1984, and was assigned to Burr-Brown Inc. In the technique disclosed therein, a solution to offset drift is described in the context of an ADC having offset drift, a portion of which may be contributed by an operational amplifier therein. They employ a differential temperature sensor that generates a temperature-dependent voltage, Vt. During calibration at ambient temperature, that voltage is applied to the ADC input to obtain a sixteen-bit digital representation of Vt, which is stored. Then, in use, after an analog sample is converted the differential temperature sensor is applied to the input again, to obtain another sixteen-bit digital representation of Vt for whatever the present temperature is. The difference between the two values is used to do a look-up in a gain and offset drift storage register, which is preprogrammed to contain the amount of gain and offset drift that occurs as a function of temperature change. The sixteen-bit digital representation of the analog sample is compensated by that amount to obtain the final digital value for the analog sample.

It is therefore desirable to have an op-amp including compensation for offset drift that is effective over an intended temperature range, while at the same time offering a minimal performance penalty for the op-amp.

SUMMARY OF THE INVENTION

In accordance with the present invention there is provided a method and apparatus for compensating for offset and drift of offset in an amplifier circuit having metal oxide semiconductor transistors in an input stage thereof and including a node responsive to a bias to change the offset of the amplifier circuit. In one embodiment, an offset digital-to-analog converter provides a first programmable bias corresponding to an offset of the amplifier circuit. A drift digital-to-analog converter provides a second programmable bias corresponding to a drift of the offset of the amplifier circuit. The first programmable bias and the second programmable bias are combined and coupled to the node. In another embodiment, a first programmable offset/drift generator is provided, capable of sourcing a first bias to the amplifier node compensating for a first portion of the offset and a first portion of the drift of the offset of the amplifier circuit. A second programmable offset/drift generator is provided, capable of sourcing a second bias to the amplifier node compensating for a second portion of the offset and a second portion of the drift of the offset of the amplifier circuit, wherein the rate of drift compensation with temperature of the second bias is different from the rate of compensation of the second bias. By suitable programming of the first and second programmable offset/drift generators the compensation of the offset and the offset of the drift of the amplifier circuit may be optimized.

These and other features of the invention will be apparent to those skilled in the art from the following detailed description of the invention, taken together with the accompanying drawings.

BRIEF DESCRIPTION OF THE DRAWINGS

FIG. 6 is a diagram of a pertinent portion of the operational amplifier of FIG. 4.

FIG. 7 is a flow chart for a method in accordance with the invention.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

Figure 1:
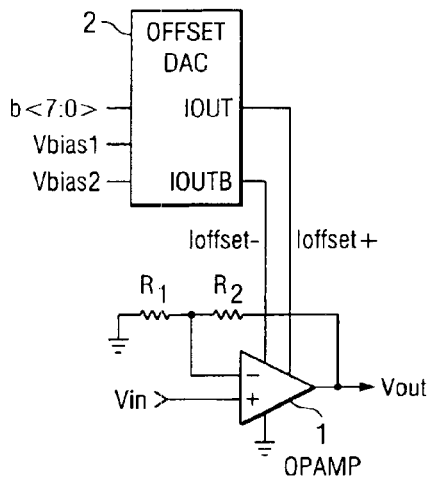
FIG. 1 is a diagram of an operational amplifier having offset compensation.

An effective approach to offset compensation is shown in FIG. 1. In this, a conventional Op-Amp 1 is configured as an amplifier to amplify an input voltage Vin to generate an output voltage Vout, with resistors $R_1$ and $R_2$ determining the overall gain of the circuit by the well-known formula:

$$gain = \frac{Vout}{Vin} = \frac{(R1 + R2)}{R1}.$$

To compensate for offset error, a programmable offset DAC 2 is provided, that provides a programmable differential offset current bias, comprising positive component ioffset+ and negative component ioffset−. These are programmably adjustable by the application of a digital adjustment value b<7:0>. By varying the value of b, which may be done under control of a program running on a microprocessor, for example, the magnitude of the differential offset current bias can be correspondingly varied.

The type of compensation shown in FIG. 1 is known to be effective for op-amps using bipolar technology. For bi-polar process technology, it is well known that correcting the offset error can at the same time correct for the offset drift. See, for example, *Analysis and Design of Analog Integrated Circuits*, by Paul R. Gray and Robert G. Meyer, John Wiley & Sons, Inc., © 1993, pp. 250–256, 445–458 (esp. pp. 447–453) and 466–470. To cancel offset and drift at the same time for a bipolar op-amp, a programmable current as described in the above-mentioned '713 patent can be added to the differential amplifier output branches, and this programmable current can be mirrored from the bias current source that provides the tail current of the differential stage. This scheme provides similar drift properties between the differential amplifier currents and the error correcting (programmable) current, so that offset and drift are canceled simultaneously.

On the other hand, for op-amps using CMOS input stages, it is also well known that providing offset compensation does not provide the drift compensation that occurs in op-amps having bipolar input stages. This is due to the threshold voltage, Vt, mismatch that is common between the input stage CMOS transistors. Thus, the compensation approach shown in FIG. 1 will only cancel offset error for op-amps using a CMOS input stage. However, CMOS input stages are very desirable because they require essentially zero input current. Therefore, a new approach is desirable for canceling the offset error and the offset drift if op-amps having CMOS input stages.

As mentioned above, a differential offset current bias can be provided to an op-amp in a manner intended to compensate for offset error. This can be better understood by reference to FIG. 2, which shows a pertinent portion of op-amp 1, specifically, an input portion. A conventional bias generator circuit 3 generates voltage biases and, through PMOS devices P2, P3, P4 and P5, communicates those voltage biases to PMOS devices P6, P7, P8, P9, P10 and P11, in a conventional current source circuit 4, which, in response to the biases so provided, provides current sources for a conventional folded cascode amplifier circuit 5. Folded cascode amplifier portion 5 has two parts, a differential input amplifier portion comprising NMOS devices N1 and N2 and PMOS devices P12 and P13, and a high swing current amplifier circuit comprising NMOS devices N3, N4, N5 and N6, providing an output Vfcout to the next stage in the op-amp 1.

The differential offset current biases, ioffset+ and ioffset− are provided at the sources of devices N5 and N6, respectively, as shown. The output Vfcout is also taken at the source of device N6. These biases compensate for offset error that would otherwise appear in Vfcout, and would be propagated to the op-amp output Vout.

Figure 2:
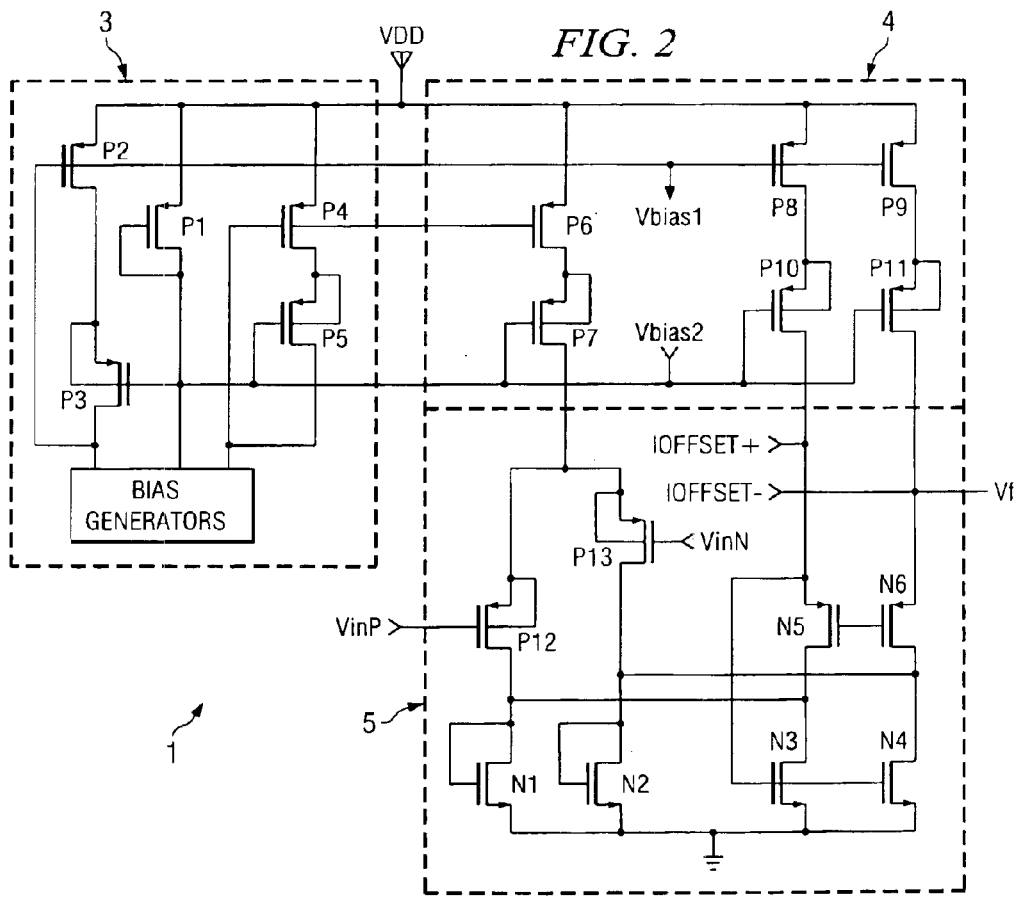
FIG. 2 is a diagram of a pertinent portion of the operational amplifier of FIG. 1.
Figure 3:
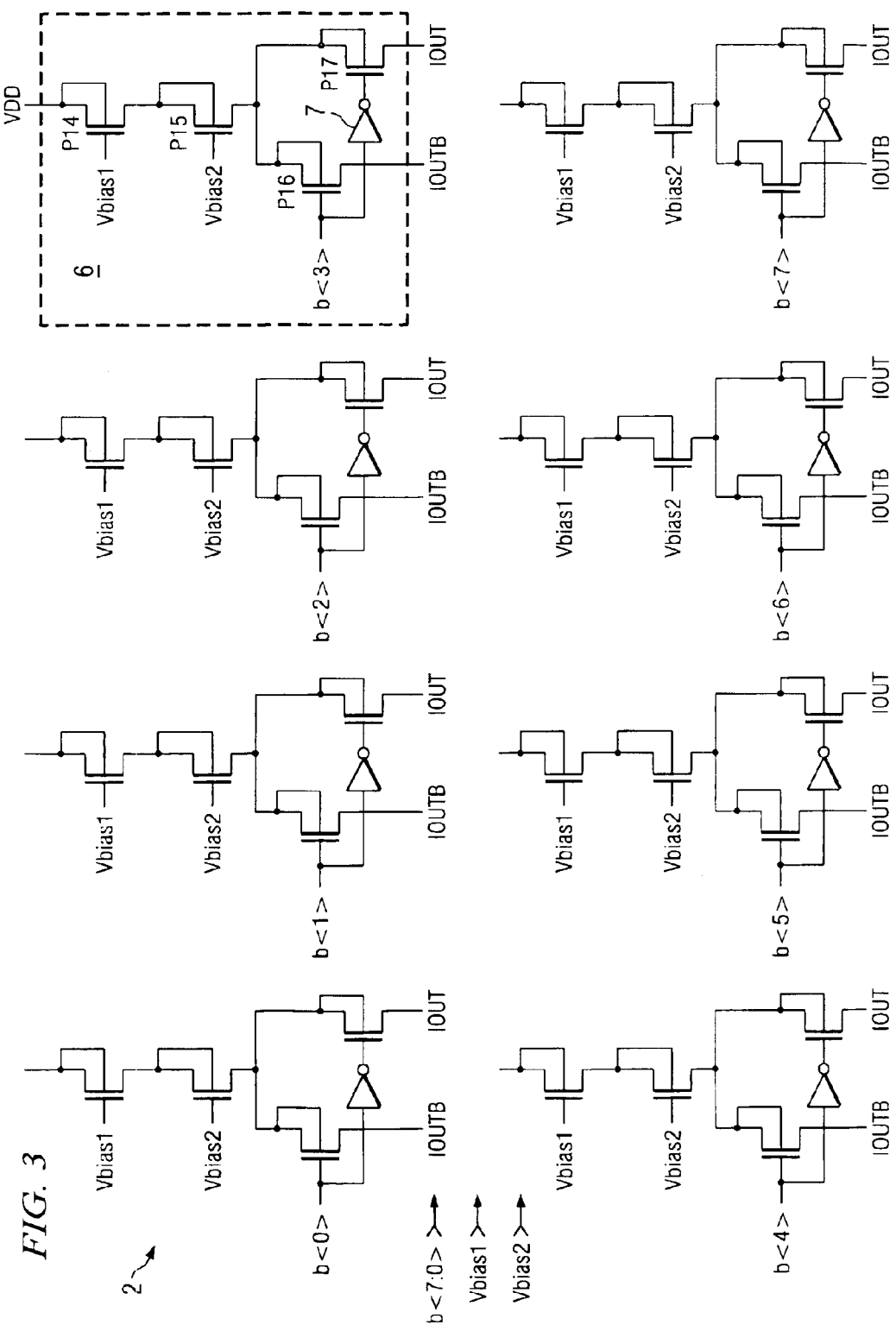
FIG. 3 is a diagram of the offset DAC of FIG. 1.

FIG. 3 is a circuit diagram of the offset DAC 2 of FIG. 2. The offset DAC 2 is comprised of eight cells, all of the same construction. Exemplary cell 6 is made of PMOS devices P14 and P15, connected in series, as shown, with the source of device P14 being connected to the power supply VDD and the drain of device P14 being connected to the source of device P15, and with the gate of device P14 receiving a voltage bias signal Vbias1, and the gate of device P15 receiving a voltage bias signal Vbias2. The drain of device P15 is connected to the source of device P16 and the source of device P17. The gate of device P16 receives the fourth bit of b<7:0>, i.e., b<3>, while gate of device P17 receives the inverse of the fourth bit of b<7:0>, being inverted by inverter 7. The drain of device P16 provides an output current ioutb, while the drain of device P17 provides an output current Iout. The bias voltages Vbias1 and Vbias2 are fixed, stable biases, and control the amount of cell current provided to devices P16 and P17. Depending on whether the value of b<3> is a "0" or a "1," the cell current is either provided as iout or ioutb, respectively.

As mentioned above, the eight cells of offset DAC 2 are all of the same construction. All of their output currents iout are summed, as are all of their output currents ioutb, to generate output currents IOUT and IOUTB, respectively, which are the same currents, ioffset+ and ioffset−, respectively, provided to Op-Amp 1. Each cell receives voltage bias signals Vbias1 and Vbias2, as described above in connection with cell 6. However, each cell receives a different bit of b<7:0>, with the first cell receiving bit b<0>, the second cell receiving bit b<1>, the third cell receiving bit b<2>, etc. In addition, the sizes of the devices corresponding to devices P16 and P17 in cell 6 are scaled so as to provide a different amount of cell current, one cell compared to the next. For example, the devices may be scaled so that the second cell provides twice the amount of cell current as the first cell, the third cell provides twice the amount of cell current as the second cell, etc., in binary fashion. Assuming that bit b<0>is the least significant bit (LSB) of b and bit b<7> is the most significant bit (MSB) of b, given such scaling the output currents, the output currents IOUT and IOUTB can be controlled in binary fashion simply by setting the programmable value b to the appropriate value. By selecting b to be a two's complement value, the mid-point of the range of output currents IOUT and IOUTB can be made to correspond to a value of b of "0."

By selecting Vbias1 and Vbias2 to provide a total cell current, for a two's complement value of b=0, at approximately the anticipated output currents IOUT and IOUTB to compensate an op-am such as op-amp 1 (FIGS. 1 and 2) for offset error, the actual offset error for a specific Op-Amp can be significantly reduced by "fine tuning" the output currents IOUT and IOUTB by selection of the appropriate value of b for that op-amp. Note that while having a binary scaling of current, one cell to the next, and having b as a two's complement value are advantageous expedients, other scaling schemes and other valuing schemes for b are possible.

The offset DAC 2 of FIG. 3 may use the bias generator 3 (FIG. 2) of op-amp 100 to set its bias voltages Vbias1 and Vbias2. Note also that the particular implementation of the offset DAC 2 is exemplary only. Other implementations may be used, for example using binary/unary/segmented, push/pull/push-pull configurations, and still be within the scope of the invention.

However, even with the provision of an offset DAC as described above in conjunction with FIGS. 1, 2 and 3, the offset compensation so provided is subject to drift with temperature. Therefore, even though a value of b may be selected to provide greatly reduced offset error at a particular temperature, if the device is operated at a different temperature, the offset error will likely increase because of offset drift.

Figure 4:
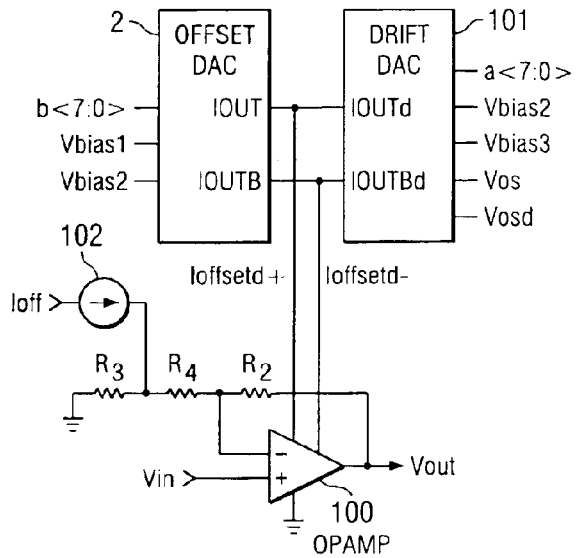
FIG. 4 is a diagram of an operational amplifier having offset compensation and offset drift compensation.

To compensate for such offset drift, a programmable drift DAC 101 is provided, as shown in FIG. 4. The drift DAC 101 provides a programmable differential drift current bias, comprising positive component IOUTd and negative component IOUTBd. These are programmably adjustable by the application of a digital adjustment value a<7:0>. By varying the value of a, which may be done under control of a program running on a microprocessor, for example, the magnitude of the differential drift current bias can be correspondingly varied. The currents IOUTd and IOUTBd, respectively, from drift DAC 101 are added to the currents IOUT and IOUTB, respectively, from offset DAC 2, to yield the compensating currents ioffsetd+ and ioffsetd− that are applied to op-amp 100 in a manner similar to that in which ioffset+ and ioffset− are applied to Op-Amp 1 of FIG. 1.

Figure 5:
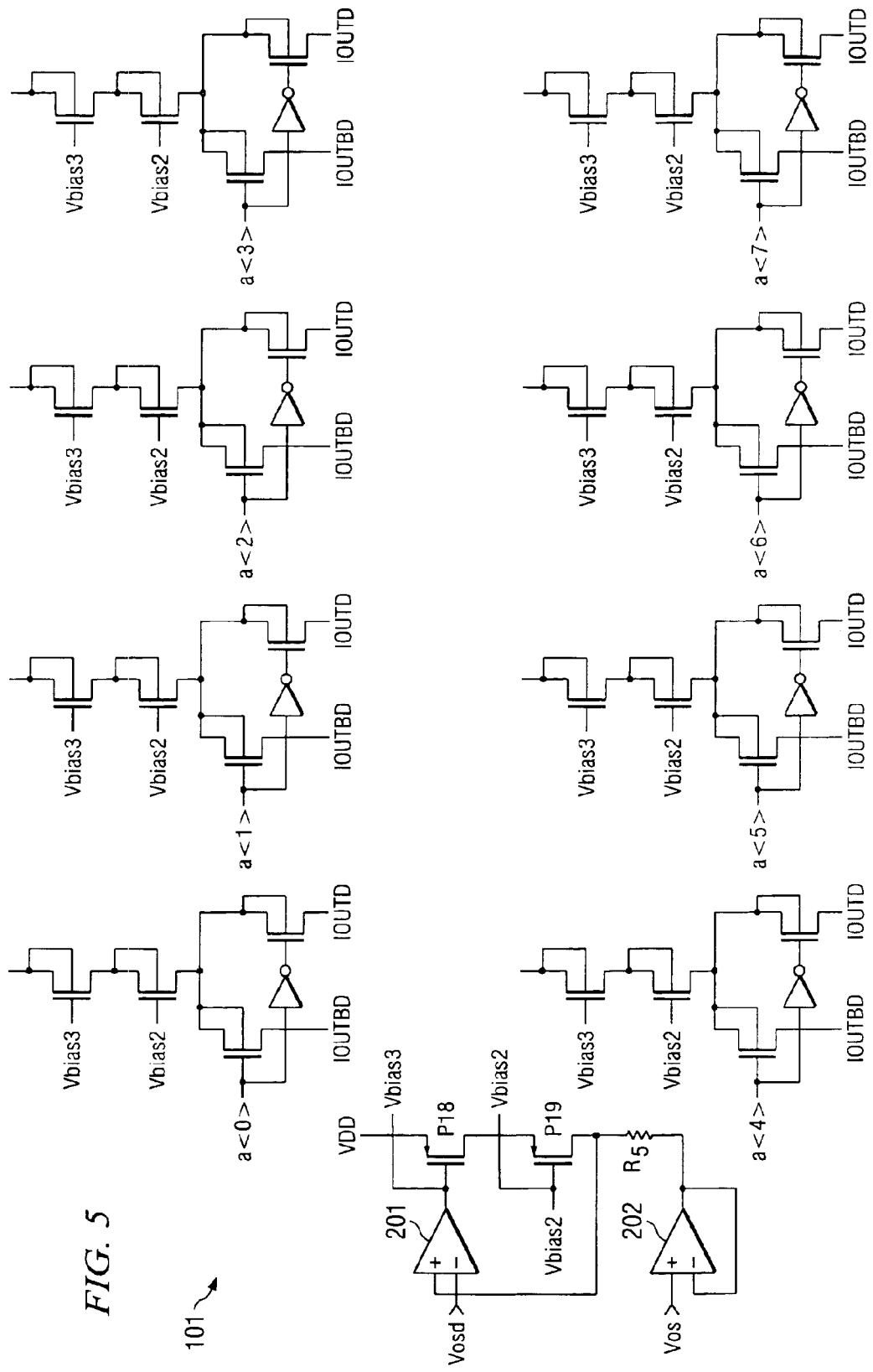
FIG. 5 is a diagram of the drift DAC of FIG. 4.

In addition, when the drift compensated compensating currents ioffsetd+ and ioffsetd− are selected for optimum drift compensation and applied to Op-Amp 100 as described below, a residual offset may remain in the output of Op-Amp 100. In order to compensate for this residual offset, a further offset compensation is provided, as shown in FIG. 4, by dividing resistor $R_1$ into resistors $R_3$ and $R_4$, and connecting a conventional, programmable current source 102 providing current Ioff to the node connecting resistors $R_3$ and $R_4$. The current source needs to provide temperature independent offset. Such a programmable current providing temperature independent offset can be obtained by a circuit similar to the circuit shown in FIG. 5. The temperature drift of resistor $R_5$ in FIG. 5 is cancelled when current is applied as shown in FIG. 4 to similar type resistors $R_2$, $R_3$, $R_4$. The current can be mirrored and used as push-pull fashion also, and can be designed to have binary/unary segmentation. This type of residual offset correction scheme requires drift-matched resistors to be on-chip. Since the residual offset correction will be temperature independent, this programmable current source may be used to replace the offset-DAC shown in FIG. 4.

Drift DAC 101 is shown in detail in FIG. 5. In the right of the figure can be seen eight cells. These eight cells are of the same construction as the eight cells shown in FIG. 3, and their operation is the same. Therefore, description of their construction and operation is not repeated in detail here, in the interest of brevity and clarity. However, instead of receiving voltage bias signal Vbias1 and Vbias2, each of the cells in drift DAC 101 receives voltage bias signals Vbias2 and Vbias3, respectively, as shown. Voltage Vbias2 is applied externally, while voltage Vbias3 is generated internally, as will now be described. The voltages generated by the cells are called ioutd and ioutbd. When combined, they form the drift compensating currents IOUTd and IOUTBd, respectively.

Drift DAC 101 includes two op-amps 201 and 202. Op-amp 202 is optional. The inverting input of op-amp 201 receives a further stable voltage bias Vosd, while its non-inverting input is connected to a first end of a resistor $R_5$. The output of op-amp 201 is connected to the gate of a PMOS device P18 having its source connected to the power supply VDD. The drain of device P18 is connected to the source of a PMOS device P19, which has its gate connected to receive voltage Vbias2 and its drain connected to the first end of resistor $R_5$. The non-inverting input of op-amp 202 receives a still further stable voltage bias Vos, while its inverting input is connected to its output and to the second end of resistor $R_5$.

Note that on a data converter utilizing a drifting main op-amp, matched resistors are available to do the residual offset cancellation shown in FIG. 4 ($R_2$, $R_3$, $R_4$) and FIG. 5 ($R_5$). However, on a stand-alone op-amp, some of these resistors will be external, and they will not necessarily match with the internal resistors or with each other. In other words, the need for external resistors with good matching properties will increase system cost. This complicates the offset cancellation at all temperatures for a stand-alone op-amp. To simplify simultaneous offset and drift cancellation of such stand-alone op-amps, one exemplary embodiment of the present invention includes a combination configuration, where two DACs source currents to the main op-amp to cancel offset and drift at the same time.

In this arrangement, the roles of the offset DAC and drift DAC are shared by each DAC 2 and 101. The arrangement shown in FIG. 4 is used and both DACs 2 and 101 use the architecture described in FIG. 5. The programmable current source 102 correcting for the residual offset error in FIG. 4 is no longer needed, but it could still be used for fine tuning.

This arrangement drives a stable current across resistor $R_5$ of FIG. 5. Resistor $R_5$ is constructed of a suitable material having a resistance that varies with temperature in a known way. The basis for selecting the resistance value R5 for resistor $R_5$ is as follows. In general. for a resistor $R_n$ having a resistance Rn and having a drift coefficient DRIFTn, in parts per million per degree Celsius (ppm/° C.), the dependence of Rn on temperature T in degrees Celsius, relative to a reference temperature of 25° C., can be expressed as:

$$Rn(T)=Rn(25)+Rn \cdot \text{DRIFT}n \cdot (T-25) \qquad \text{Eq.(1)}$$

In general, for a typical CMOS process, DRIFTn for polysilicon resistors may be approximately 800 ppm/° C., and for metal resistors may be 3000 ppm/° C. Thus, a current In through resistor $R_n$ due to a voltage V across it, may be expressed as:

$$In(T)=V/Rn(T)=(V/Rn(25)) \cdot (1/(1+\text{DRIFT}n \cdot (T-25))) \qquad \text{Eq.(2)}$$

This equation may be linearized using a Taylor expansion around T=25° C. If only the first two terms of the Taylor series are kept, the approximate temperature dependence of Iref becomes:

$$In(T)=C1(1+A1 \cdot (T-25)) \qquad \text{Eq.(3)}$$

where C1 and A1 are Taylor series coefficients depending on V, Rn(25) and DRIFTn. Specifically, C1=V/Rn(25), and A1=−DRIFTn/(676·C1).

Referring now to FIG. 5, and applying the above principles, the current IOUTd from drift DAC 101 can be expressed as:

$$IOUTd(T) = a \cdot C1 \cdot (1 + A1 \cdot ((T-25)), \quad \text{Eq.(4)}$$

where a is the digital code applied to drift DAC 101. Referring back now to FIG. 4, assuming that the offset DAC 2 uses the architecture shown in FIG. 5, and again based on resistor $R_5$ having a resistance R5 and having a drift coefficient DRIFT5, IOUT from offset DAC 101 can be expressed in ppm/° C. by Taylor series expansion as:

$$IOUT(T) = b \cdot C2 \cdot (1 + A1 \cdot ((T-25)), \quad \text{Eq.(5)}$$

where b is the digital code applied to offset DAC 2, and where C2 and A2 are Taylor series coefficients depending on V, R5'(25) and DRIFT5', where R5' and DRIFT5' are the resistance value and drift coefficient of the counterpart resistor $R_5'$ (not shown) in offset DAC 2 to resistor $R_5$ in drift DAC 101. Specifically, C2=V/R5'(25), and A2=−DRIFT5'/(676·C2).

Now, applying these principles, to correct for the offset error M at T=25° C., one must apply:

$$b = (a \cdot C1 + M)/C2 \quad \text{Eq.(6)}$$

is applied to Drift DAC 101. Therefore, an offset error M of Op-Amp 100 may be corrected provided there is a code "b" satisfying Equation (6) for any value "a". Substituting Equation (6) into Equation (5) and subtracting IOUTd from IOUT yields:

$$IOUTd - IOUT = ((a \cdot C1 \cdot A1) - (a \cdot C1 \cdot A2) - (M \cdot A2)) \cdot (T-25) - M. \quad \text{Eq.(7)}$$

Equation (7) shows that the offset error M is corrected at 25° C., with the code "a" controlling the temperature drift compensation. For an Op-Amp 100 that has a drift characteristic of D Volts/° C., the cancellation factor −D may be expressed as:

$$-D = ((a \cdot C1 \cdot A1) -$$

$$(a \cdot C1 \cdot A2) -$$

$$(M \cdot A2)) \quad \text{Eq.(8)}$$

or $$a = (D - M \cdot A2)/(C1 \cdot (A2 - A1)). \quad \text{Eq.(9)}$$

Therefore, the offset of Op-Amp 100 at 85° C. may be measured and stored on a chip including the Op-Amp 100, offset DAC 2 and Drift DAC 101. At 25° C., the test can be repeated and both the offset at 25° C., i.e., M, and the drift per degree C., i.e., D, can be measured, where:

$$D = (M(85) - M(25))/(85 - 25). \quad \text{Eq.(10)}$$

Once the values M and D are measured, then the codes "b" and "a" for simultaneously canceling the offset and drift, respectively, may be expressed as:

$$a = (D - M \cdot A2)/(C1 \cdot$$

$$(A2 - A1)), \quad \text{Eq.(11)}$$

and $$b = (a \cdot C1 + M)/C2. \quad \text{Eq.(12)}$$

From Equation (9) it can be seen that resistors $R_5$ and $R_5'$ are preferably not made of the same material, since they must have different drift characteristics.

The

Now, it was mentioned above that when the drift compensated compensating currents ioffsetd+ and ioffsetd− are selected for optimum drift compensation and applied to Op-Amp 100, a residual offset may remain, and that in order to compensate for this residual offset, a further offset compensation may be provided, as shown in FIG. 4, by dividing resistor $R_1$ into resistors $R_3$ and $R_4$, and connecting a conventional, programmable current source 102 providing current Ioff to the node connecting resistors $R_3$ and $R_4$. These resistors may be constructed of polysilicon, or any single type of resistor, as is the feedback resistor $R_2$, which causes the gain factor to remain stable with temperature. The resulting compensation, for a gain-of-two, noninverting op-amp, can be expressed as:

$$Vout = 2 \cdot Vin - R3 \cdot Ioff. \quad \text{Eq. (13)}$$

Note also that the particular implementation of the drift DAC 101 shown in FIG. 5 is exemplary only. This drift DAC may also be designed to have binary/unary/segmented, push/pull/push-pull fashions, and still be within the scope of the invention. Programmable drift DAC 101 may also use any known method of generating temperature dependent bias current. If the bias circuit of op-amp 100 (FIG. 4) uses a temperature independent current generation based on a band-gap circuit, then a good choice for the drift DAC 101 bias current is PTAT (proportional to absolute temperature). On the other hand, if the bias circuit of op-amp 100 uses a PTAT current generator, the bias current for the drift-DAC is preferably band-gap based, that is, independent of the temperature. Both cases will generate programmable drift that changes linearly with temperature. If nonlinear drift generation is desired, a drift DAC with PTAT-squared current generation could also be used. Numerous designs for generating temperature independent, PTAT and PTAT-squared currents are known in the art, and, for example, may be found in *Voltage References: From Diodes to Precision High-Order Bandgap Circuits*, by Gabriel Alfonso Rincon-Mora, IEEE, © Sep. 28, 2001 (ISBN: 0471143367).

Note that the particular place in the circuit where the compensating currents are applied to a given amplifier is a matter of design choice within the scope of those of ordinary skill in this art area. In fact, when applying the drift compensated compensating currents ioffsetd+ and ioffsetd− to the amplifier circuit of FIG. 2, it is considered preferred to apply those compensating currents to the differential input amplifier part, as shown in FIG. 6, rather than to the folded cascade circuit part shown in FIG. 2. The reason this is considered preferred is because by applying the drift compensated compensating currents as shown in FIG. 6, it has been found that better drift compensation may be achieved.

Note that while the embodiment shown in FIG. 4 provides differential compensation for a differential amplifier, the principles of the present invention are equally applicable to single-ended embodiments. In such embodiments only a single drift compensated compensating current need be generated, and applied at a single compensation node in the amplifier. In addition, while the compensation used in the embodiment shown in FIG. 4 is current compensation, voltage compensation may be provided, as well. In such embodiments a suitable node or nodes where an amplified voltage signal appears would be selected for application of the compensating voltages.

A preferred embodiment of the method of the present invention can be set forth as follows, with reference now to FIG. 7. Initially, the offset error, ∈1, of an amplifier requiring compensation is measured at one temperature, for example room temperature (25° C.), T1 301. The value of this offset is encoded and stored in nonvolatile memory 302. The offset error, ϵ2, is then measured at another temperature, for example a temperature higher than room temperature, T2 303. Then, the temperature drift, D, is calculated 304. Thus, $$\epsilon 1=\epsilon 1+D\cdot(T2-T1), \quad \text{Eq. (2)}$$

where D is the temperature drift at T1 (e.g., 25° C.), and is expressed in units of volts/degree. Then, the drift DAC 101 (FIG. 4) input code a<7:0> that cancels drift is calculated 305, and the input code b<7:0> that cancels offset is calculated 306. These codes are stored in nonvolatile memory 307. Upon initiation of regular operation, these stored values are loaded into volatile memory for use in providing the actual compensation in accordance with the principles described above.

Although the present invention and its advantages have been described in detail, it should be understood that various changes, substitutions and alterations can be made herein without departing from the spirit and scope of the invention as defined by the appended claims.

What is claimed is:

1. An apparatus for compensating for offset and drift of offset in an amplifier, comprising:
   an amplifier circuit having metal oxide semiconductor transistors in an input stage thereof and including a node responsive to a bias to change the offset of the amplifier circuit;
   an offset digital-to-analog converter providing a first programmable bias corresponding to an offset of the amplifier circuit; and
   a drift digital-to-analog converter providing a second programmable bias corresponding to a drift of the offset of the amplifier circuit;
   the first programmable bias and the second programmable bias being combined and coupled to the node.

2. A method for compensating for offset and drift of offset in an amplifier circuit having metal oxide semiconductor transistors in an input stage thereof and including a node responsive to a bias to change the offset of the amplifier circuit, comprising the steps of:
   providing a first programmable bias corresponding to an offset of the amplifier circuit;
   providing a second programmable bias corresponding to a drift of the offset of the amplifier circuit;
   combining the first programmable bias and the second programmable bias and coupling the combined biases to the node.

3. An apparatus for compensating for offset and drift of offset in an amplifier, comprising:
   an amplifier circuit having metal oxide semiconductor transistors in an input stage thereof and including a node responsive to a bias to change the offset of the amplifier circuit;
   a first programmable offset/drift generator capable of sourcing a first bias to the amplifier node compensating for a first portion of the offset and a first portion of the drift of the offset of the amplifier circuit; and
   a second programmable offset/drift generator capable of sourcing a second bias to the amplifier node compensating for a second portion of the offset and a second portion of the drift of the offset of the amplifier circuit, wherein the rate of drift compensation with temperature of the second bias is different from the rate of compensation of the second bias, such that by suitable programming of the first and second programmable offset/drift generators the compensation of the offset and the offset of the drift of the amplifier circuit may be optimized.

4. A method for compensating for offset and drift of offset in an amplifier circuit having metal oxide semiconductor transistors in an input stage thereof and including a node responsive to a bias to change the offset of the amplifier circuit, comprising the steps of:
   providing a first programmable bias to the amplifier node compensating for a first portion of the offset and a first portion of the drift of the offset of the amplifier circuit; and
   providing a second programmable bias to the amplifier node compensating for a second portion of the offset and a second portion of the drift of the offset of the amplifier circuit; and
   controlling the rate of drift compensation with temperature of the first bias and the second bias such that the second bias is different from the rate of compensation of the second bias and the compensation of the offset and the offset of the drift of the amplifier circuit is optimized.

5. A method for compensating for offset and drift of offset in an amplifier circuit having metal oxide semiconductor transistors in an input stage thereof and including a node responsive to a bias to change the offset of the amplifier circuit, comprising the steps of:
   measuring a first offset error at a first temperature;
   storing the first offset error in a first memory;
   measuring a second offset error at a second temperature;
   storing the second offset error in the first memory;
   computing drift and offset at the first temperature, based on the first offset error;
   computing an offset compensation code;
   storing the offset compensation code in a second, nonvolatile memory;
   computing an offset drift compensation code;
   storing the offset drift compensation code in the second memory; and upon activation of the amplifier circuit:
   retrieving the offset compensation code and the offset drift compensation code;
   responsive to the retrieved offset compensation code, providing a first programmable bias corresponding to an offset of the amplifier circuit;
   responsive to the retrieved offset drift compensation code, providing a second programmable bias corresponding to a drift of the offset of the amplifier circuit;
   combining the first programmable bias and the second programmable bias and coupling the combined biases to the node.

* * * * *